United States Patent
Huang

(10) Patent No.: US 9,401,701 B1
(45) Date of Patent: Jul. 26, 2016

(54) TIME SIGNAL GENERATING CIRCUIT AND TIME SIGNAL GENERATING METHOD

(71) Applicant: uPI Semiconductor Corp., Hsinchu County (TW)

(72) Inventor: Kun-Min Huang, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 14/790,008

(22) Filed: Jul. 2, 2015

(30) Foreign Application Priority Data

Mar. 20, 2015 (TW) .............................. 104108994 A

(51) Int. Cl.
    *G06F 1/04* (2006.01)
    *H03K 5/156* (2006.01)

(52) U.S. Cl.
    CPC .................................. *H03K 5/1565* (2013.01)

(58) Field of Classification Search
    CPC .................................................... H03K 5/1565
    See application file for complete search history.

(56) References Cited

U.S. PATENT DOCUMENTS

| 8,629,662 B2 | 1/2014 | Laur et al. |
| 2014/0097818 A1 | 4/2014 | Wiktor et al. |
| 2014/0176097 A1* | 6/2014 | Huang ............... H02M 3/1584 323/272 |

* cited by examiner

*Primary Examiner* — Daniel Puentes
(74) *Attorney, Agent, or Firm* — Jianq Chyun IP Office

(57) ABSTRACT

A time signal generating circuit and a time signal generating method are provided. The time signal generating method includes following steps: getting a first phase signal and a second phase signal, wherein the first phase signal is related to a first phase current and the second phase signal is related to a second phase current; sampling and holding the first phase signal to generate a first signal and sampling and holding the second phase signal to generate a second signal; using an error amplifier to generate a balance signal according to the first signal and the second signal; and generating a time signal according to the balance signal. The present invention is capable of avoiding the imbalance of each phase current caused by the offset values between different elements in conventional technology.

17 Claims, 9 Drawing Sheets

_US 9,401,701 B1_

TIME SIGNAL GENERATING CIRCUIT AND TIME SIGNAL GENERATING METHOD

CROSS-REFERENCE TO RELATED APPLICATION

This application claims the priority benefit of Taiwan application serial no. 104108994, filed on Mar. 20, 2015. The entirety of the above-mentioned patent application is hereby incorporated by reference herein and made a part of this specification.

BACKGROUND OF THE INVENTION

1. Field of the Invention

The invention relates to a voltage converting technique, and more particularly, to a time signal generating circuit and a time signal generating method for application in a multi-phase power converter.

2. Description of Related Art

FIG. 1 is a schematic diagram illustrating a multi-phase power converter in conventional art. FIG. 2 is a waveform diagram of the multi-phase power converter in conventional art. Referring to FIG. 1 and FIG. 2 together, a multi-phase power converter 1 in conventional art usually adopts design of a constant on-time architecture. The multi-phase power converter 1 is a two-phase power converter. A driving circuit 10 drives a first phase output stage to generate a first phase current (a first inductive current) IL1, and the driving circuit 10 drives a second phase output stage to generate a second phase current (a second inductive current) IL2. The first phase current IL1 and the second phase current IL2 flow into a load and generate an output voltage Vout at an output terminal of the multi-phase power converter 1. A feedback signal Vfb is related to the output voltage Vout. A comparator 12 compares the feedback signal Vfb with a reference voltage Vref to generate an error signal Xerr. A ramp generator 16 generates a ramp signal Xramp. A comparator 14 compares the error signal Xerr with the ramp signal Xramp to generate a comparing signal Xcm.

A logic control circuit 24 generates a control signal according to the comparing signal Xcm to control the ramp generator 16, a current balancing circuit 18, a first on-time generator 20a and a second on-time generator 20b. The logic control circuit 24 generates a first phase pulse width modulation (PWM) signal PWM1 according to a first phase on-time signal Ton_1, and the logic control circuit 24 generates a second phase pulse width modulation signal PWM2 according to a second on-time signal Ton_2. The driving circuit 10 controls switches UG1 and LG1 of the first phase output stage according to the first phase pulse width modulation signal PWM1, and the driving circuit 10 controls switches UG2 and LG2 of the second phase output stage according to the second phase pulse width modulation signal PWM2.

The current balancing circuit 18 determines whether each phase current is in balance according to a first phase signal LX1 and a second phase signal LX2, and sends a determination result to the first on-time generator 20a and the second on-time generator 20b. The first on-time generator 20a generates the first phase on-time signal Ton_1 according to said determination result, the control signal of the logic control circuit 24, an input voltage Vin, and the output voltage Vout. The second on-time generator 20b generates the second phase on-time signal Ton_2 by operations similar to the above.

FIG. 3 is a circuit diagram of an on-time generator in conventional art. Referring to FIG. 3, an on-time generator 20 includes a current source It, P-type metal oxide semiconductor transistors MP1 and MP2, a switch ST, a capacitor CT and a comparator 26. The current source It and the P-type metal oxide semiconductor transistors MP1 and MP2 compose a current mirror. The current source It is related to the input voltage Vin. When a pulse width modulation signal is at logic high level ("high"), an inversion signal PWMB relative to the pulse width modulation signal is at logic low level (low), such that the switch ST is cut off. Further, the comparator 26 stops counting for an on-time signal Ton only when "a current M*It (a magnification coefficient M multiplied by the current It)" is used to charge the capacitor CT until a level of a charging voltage Xc is greater than the output voltage Vout.

The first on-time generator 20a and the second on-time generator 20b in FIG. 1 have the structure similar to that of the on-time generator 20 in FIG. 3. The on-time signal Ton of each phase is used to determine a time length of the pulse width modulation signals PWM of each phase at logic high level ("high"), that is, to determine a time length of the (high side) switches UG1 and UG2 of each phase at logic high level. In view of FIG. 3, it can be known that an on-time is obtained through a calculation processing of the input voltage Vin and the output voltage Vout.

FIG. 4 is a circuit diagram applying the current balancing circuit 18 in conventional art. FIG. 5 is a waveform diagram of the related signals in FIG. 4. Referring to FIG. 4 and FIG. 5 together, the first phase pulse width modulation signal PWM1, a control signal SW1 and a first holding control signal Hold_1 are identical in terms of the phase, whereas a first sampling control signal Sample_1 is an inversion signal of the first holding control signal Hold_1. Similarly, the second phase pulse width modulation signal PWM2, a control signal SW2 and a second holding control signal Hold_2 are identical in terms of level variation, whereas a second sampling control signal Sample_2 is an inversion signal of the second holding control signal Hold_2.

The current balancing circuit 18 includes current balancing units 18a and 18b. The current balancing units 18a and 18b have the same structure. For example, the current balancing unit 18a uses an amplifier 22a and a plurality of current mirrors, and the current balancing unit 18b also uses an amplifier 22b and a plurality of current mirrors. A resistance RSN is used to convert voltage information into current information by, for example, dividing "a reference voltage Voffset minus the first phase signal LX1" by the resistance RSN.

When the first phase pulse width modulation signal PWM1 is at logic high level ("high"), the control signal SW1 is at logic high level. Each of values obtained after subtraction of the signals (information) sampled from the first phase signal LX1 and the second phase signal LX2 are calculated by the current mirrors is sent to a terminal of a resistance RCB, so that a voltage at another terminal of the resistance RCB may be latched at a value of the output voltage Vout by a buffer. A high-boundary voltage VTON_HB1 is obtained through a calculation processing of subtracting "the resistance RCB multiplied by a current IDFF1 (IDFF1=ISN1−ISN2)" from the output voltage Vout. The high-boundary voltage VTON_HB1 may replace the output voltage Vout of the on-time generator 20 in FIG. 3 to serve as a counting high-boundary voltage. The comparator 26 stops counting for the on-time signal Ton only until the level of the charging voltage Xc is greater than the high-boundary voltage VTON_HB1.

Another high-boundary voltage VTON_HB2 is obtained through a calculation processing of subtracting "the resistance RCB multiplied by a current IDFF2 (IDFF2=ISN2−ISN1)" from the output voltage Vout.

In the multi-phase power converter, whether the current of each phase is in balance needs to be considered. If the current balance is not considered, the current of one specific phase may output more current than a channel of another phase and lead to serious problems of overheat and burnout to the circuit. In addition, the current balancing unit 18a and the current balancing unit 18b have the same structure, and each of said units uses one amplifier and multiple current mirrors. In general, the amplifier includes an offset value of its own, whereas the multiple current mirrors also include offset values of their own. For example, an offset value of the amplifier 22a is 0 mV, whereas an offset value of the amplifier 22b is 20 mV; and conversion coefficients of three current mirrors of the current balancing unit 18a are 1.01, 1.01 and 0.99, whereas conversion coefficients of three current mirrors of the current balancing unit 18b are 0.99, 0.98 and 1. Because the offset values of the amplifier 22a and the amplifier 22b are already different while the multiple current mirrors also result in many offsets, the offset values of the inductive currents (IL1 and IL2) in FIG. 1 may be overly large. In other words, it is an indispensable part as to solve a current balancing issue in design of the multi-phase power converter.

SUMMARY OF THE INVENTION

Accordingly, the invention is directed a time signal generating circuit and a time signal generating method for application in a multi-phase power converter, so as to solve the problem as mentioned in Description of Related Art.

The invention provides a time signal generating method. The time signal generating method includes the following steps. (A) A first phase signal and a second phase signal are got, wherein the first phase signal is related to a first phase current and the second phase signal is related to a second phase current. (B) The first phase signal is sampled and held to generate a first signal and the second phase signal is sampled and held to generate a second signal. (C) The error amplifier is used to generate a balance signal according to the first signal and the second signal. (D) A time signal is generated according to the balance signal.

In an embodiment of the invention, the step (C) further includes: receiving the first signal and the second signal respectively by a first input terminal and a second input terminal of the error amplifier during a first half-cycle to generate a first error signal, and exchanging the received signals with each other by the first input terminal and the second input terminal of the error amplifier during a second half-cycle varied with time to generate a second error signal, wherein the balance signal includes the first error signal and the second error signal. One cycle includes the first half-cycle and the second half-cycle.

In an embodiment of the invention, the step (D) further includes: generating a first time signal according to the first error signal during the first half cycle, and generating a second time signal according to the second error signal during the second half-cycle. The time signal includes the first time signal and the second time signal.

In an embodiment of the invention, when an on-time of the time signal exceeds 50% of a cycle, an effect of the on-time for affecting a current balancing of a multi-phase power converter is 50% of the cycle.

In an embodiment of the invention, the step (D) further includes: affecting a current of an on-time generator according to the balance signal to generate the time signal.

In an embodiment of the invention, the step (D) further includes: affecting a counting high-boundary voltage of an on-time generator according to the balance signal to generate the time signal.

The invention further provides a time signal generating circuit. The time signal generating circuit includes a sampling and holding circuit and a current balance regulating circuit. The sampling and holding circuit acquires a first phase signal and a second phase signal. The sampling and holding circuit samples and holds the first phase signal to generate a first signal and samples and holds the second phase signal to generate a second signal. The first phase signal is related to a first phase current and the second phase signal is related to a second phase current. The current balance regulating circuit includes an error amplifier. The error amplifier generates a balance signal according to the first signal and the second signal. The time signal generating circuit generates a time signal according to the balance signal.

In an embodiment of the invention, the sampling and holding circuit includes a first sampling and holding unit and a second sampling and holding unit. The first sampling and holding unit receives the first phase signal to generate the first signal. The second sampling and holding unit receives the second phase signal to generate the second signal.

In an embodiment of the invention, the first sampling and holding unit includes a first switch, a first capacitor, a second switch and a second capacitor. The second sampling and holding unit includes a third switch, a third capacitor, a fourth switch and a fourth capacitor. A first terminal of the first switch receives the first phase signal. The first capacitor is coupled between a second terminal of the first switch and a ground. A first terminal of the second switch is coupled to the second terminal of the first switch. The second capacitor is coupled between a second terminal of the second switch and the ground. A coupling point between the second terminal of the second switch and the second capacitor outputs the first signal. The first switch and the second switch are controlled by a first sampling control signal and a first holding control signal respectively. The first sampling control signal and the first holding control signal are mutually inverse. A first terminal of the third switch receives the second phase signal. The third capacitor is coupled between a second terminal of the third switch and the ground. A first terminal of the fourth switch is coupled to the second terminal of the third switch. The fourth capacitor is coupled between a second terminal of the fourth switch and the ground. A coupling point between the second terminal of the fourth switch and the fourth capacitor outputs the second signal. The third switch and the fourth switch are controlled by a second sampling control signal and a second holding control signal respectively. The second sampling control signal and the second holding control signal are mutually inverse.

In an embodiment of the invention, a first input terminal and a second input terminal of the error amplifier receive the first signal and the second signal respectively during a first half-cycle to generate a first error signal, and the first input terminal and the second input terminal of the error amplifier exchange the received signals with each other during a second half-cycle varied with time to generate a second error signal. The balance signal includes the first error signal and the second error signal, and one cycle includes the first half-cycle and the second half-cycle.

In an embodiment of the invention, the current balance regulating circuit includes the error amplifier and a switch unit. The switch unit includes a plurality of switches. The switch unit is coupled to the error amplifier. The switch unit makes a first input terminal and a second input terminal of the error amplifier to receive the first signal and the second signal respectively during a first half-cycle to generate a first error signal, and an output terminal of the error amplifier is coupled to a first charging and discharging unit. The first charging and discharging unit generates a first time signal according to the first error signal. The switch unit makes the first input terminal and the second input terminal of the error amplifier to exchange the received signals with each other during a second half-cycle varied with time to generate a second error signal, and an output terminal of the error amplifier s coupled to a second charging and discharging unit. The second charging and discharging unit generates a second time signal according to the second error signal. The balance signal includes the first error signal and the second error signal. The time signal includes the first time signal and the second time signal, and one cycle includes the first half-cycle and the second half-cycle.

In an embodiment of the invention, the switch unit includes a fifth switch to a tenth switch. A first terminal of the fifth switch and a first terminal of the seventh switch receive the sampled and held first phase signal. A first terminal of the sixth switch and a first terminal of the eighth switch receive the sampled and held second phase signal. A first terminal of the ninth switch is coupled to the output terminal of the error amplifier and a second terminal of the ninth switch is coupled to the first charging and discharging unit. A first terminal of the tenth switch is coupled to the output terminal of the error amplifier and a second terminal of the tenth switch is coupled to the second charging and discharging unit. The first input terminal of the error amplifier is coupled to a second terminal of the fifth switch and a second terminal of the sixth switch, and the second input terminal of the error amplifier is coupled to a second terminal of the seventh switch and a second terminal of the eighth switch. The fifth switch, the eighth switch and the ninth switch are controlled by a first control signal, the sixth switch, the seventh switch and the tenth switch are controlled by a second control signal, the first control signal and the second control signal are a logic first level and a logic second level respectively during the first half-cycle, and the first control signal and the second control signal are the logic second level and the logic first level respectively during the second half-cycle.

In an embodiment of the invention, the first control signal is set and the second control signal is reset according to a comparing signal, or the first control signal is reset and the second control signal is set according to the comparing signal, wherein the comparing signal is related to a ramp signal and an output voltage.

In an embodiment of the invention, the first charging and discharging unit includes a first current source, a fifth capacitor and an eleventh switch. The first current source is coupled to the second terminal of the ninth switch. The fifth capacitor is coupled to the first current source, and the fifth capacitor is coupled between the second terminal of the ninth switch and a ground. The eleventh switch is connected to the fifth capacitor in parallel. The second charging and discharging unit includes a second current source, a sixth capacitor and a twelfth switch. The second current source is coupled to the second terminal of the tenth switch. The sixth capacitor is coupled to the second current source, and the sixth capacitor is coupled between the second terminal of the tenth switch and the ground. The twelfth switch is connected to the sixth capacitor in parallel. The eleventh switch and the twelfth switch are controlled by an inversion signal of a first phase pulse width modulation signal and an inversion signal of a second phase pulse width modulation signal respectively.

In an embodiment of the invention, the time signal generating circuit is disposed in a multi-phase power converter, and the multi-phase power converter includes an on-time generator. The on-time generator affects a current of the on-time generator according to the balance signal to generate the time signal.

In an embodiment of the invention, the time signal generating circuit may be disposed in a multi-phase power converter, and the multi-phase power converter may include an on-time generator. The on-time generator affects a counting high-boundary voltage of the on-time generator according to the balance signal to generate the time signal.

Based on the above, according to the time signal generating circuit and the time signal generating method of the invention, when the current balance of the multi-phase power converter is to be calculated, the same error amplifier may used to reduce the offset values of the inductive currents for each phase. In addition, the first signal and the second signal are received respectively by the first input terminal and the second input terminal of the error amplifier during the first half-cycle to generate the first error signal, and the received signals are exchanged with each other by the first input terminal and the second input terminal of the error amplifier during the second half-cycle varied with time to generate the second error signal. As such, by performing the sampling and holding operation first before using the same error amplifier to generate the balance signal according to the first signal and the second signal, the imbalance of each phase current caused by the offset values between different elements (e.g., the circuit including two sets of "the amplifier and the multiple current mirrors") in conventional technology may be avoided.

However, the above descriptions and the below embodiments are only used for explanation, and they do not limit the scope of the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
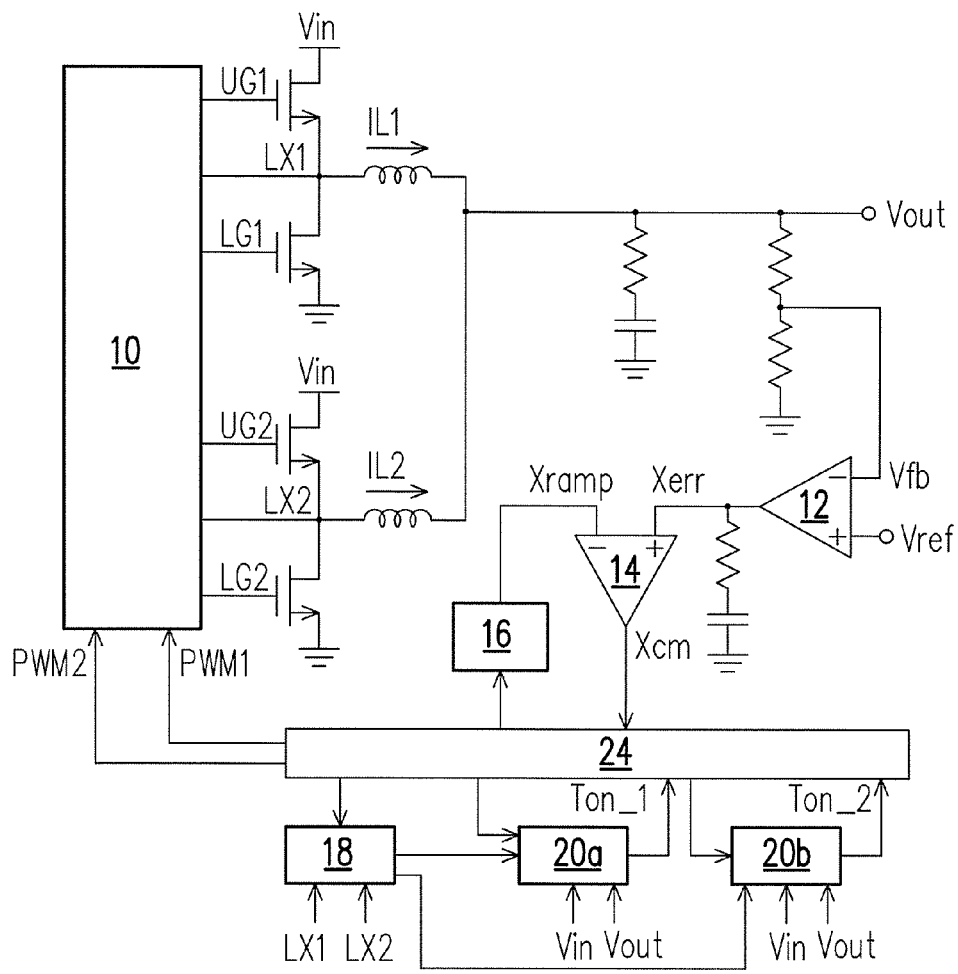
FIG. 1 is a schematic diagram illustrating a multi-phase power converter in conventional art.
Figure 2:
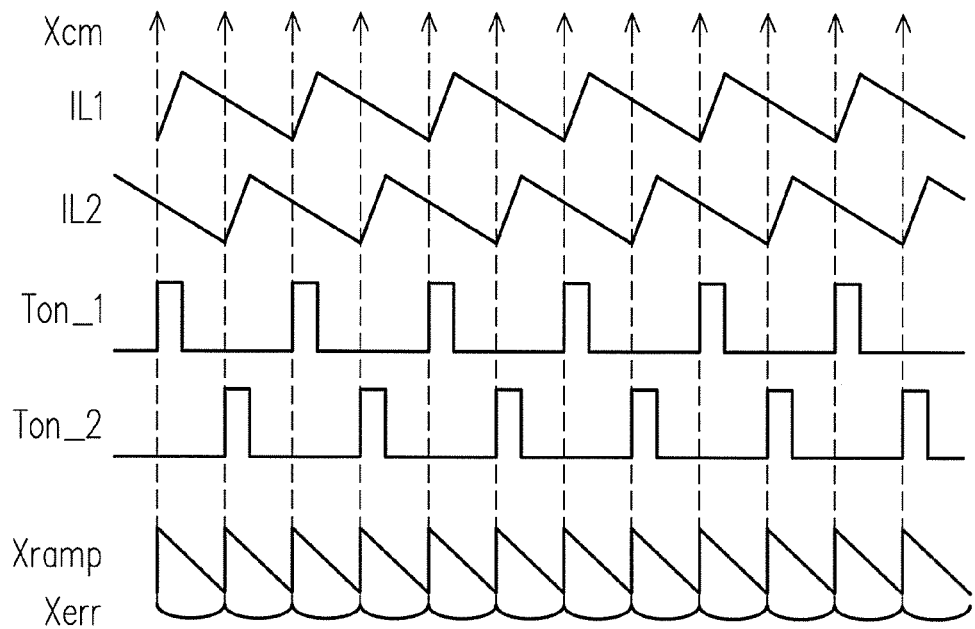
FIG. 2 is a waveform diagram of the multi-phase power converter in conventional art.

Reference will now be made in detail to the present preferred embodiments of the invention, examples of which are illustrated in the accompanying drawings. Wherever possible, the same reference numbers are used in the drawings and the description to refer to the same or like parts.

In the following embodiments, when a "A" device is "connected" or "coupled" to a "B" device, the "A" device may be directly connected or coupled to the "B" device, or other devices may probably exist there between. The term "circuit" may represent at least one element or a plurality of elements, or at least one element or a plurality of elements actively and/or passively coupled to each other to provide suitable functions. The term "signal" may represent at least one current, voltage, load, temperature, data or other signal. A ramp signal may also be a ramp-like signal, a triangular wave signal or a sawtooth signal, and may be a ramp in a repeat-declining manner or a ramp in a repeat-inclining manner, which is determined according to an actual application. It should be understood that, with respect to signals referred throughout the specification and the drawings, a physical property thereof may be voltage or current.

It should be understood that, although terms including first, second and the like are used to describe various elements in the specification, these elements should not be limited by such terms. Such terms are merely used to distinguish one element from another element. For instance, without departing from teachings in the content of the present disclosure, a first switch may also be referred to as a second switch, and similarly, the second switch may be referred to as the first switch.

Figure 6:
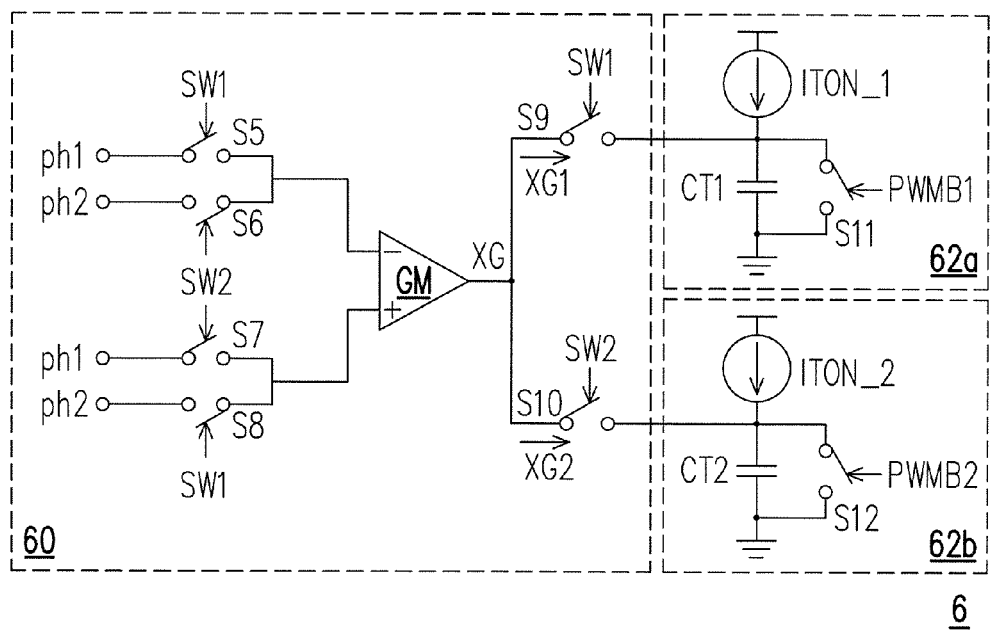
FIG. 6 is a partial circuit diagram of a time signal generating circuit according to an embodiment of the invention.
Figure 7:
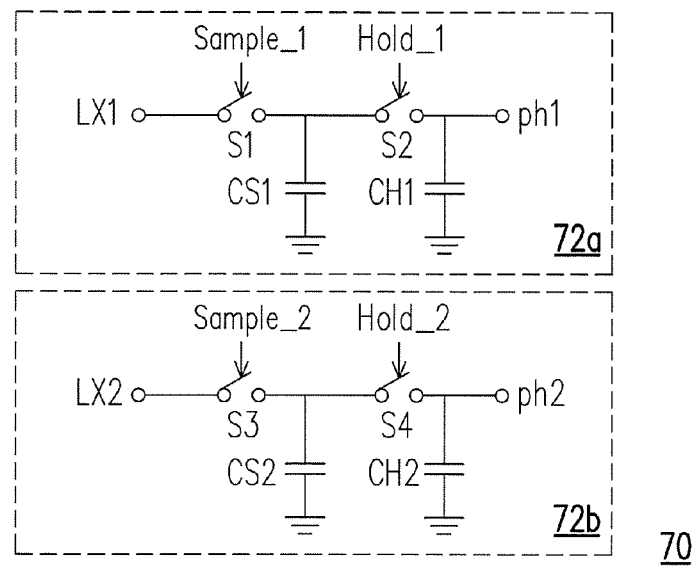
FIG. 7 is a partial circuit diagram of a time signal generating circuit according to an embodiment of the invention.

FIG. 6 is a partial circuit diagram of a time signal generating circuit according to an embodiment of the invention. FIG. 7 is a partial circuit diagram of a time signal generating circuit according to an embodiment of the invention. Referring to FIG. 6 and FIG. 7 together, a time signal generating circuit 6 includes a sampling and holding circuit 70 and a current balance regulating circuit 60, and is applicable on a multi-phase power converter (especially applicable on the two-phase power converter in FIG. 1) to generate a time signal.

In view of FIG. 7, in the previous cycle, voltage values of the first phase signal LX1 and the second phase signal LX2 obtained by the sampling and holding circuit 70 are going through an operational process of sampling and holding. The first phase signal LX1 is related to the first phase current (the first inductive current) IL1 and the second phase signal LX2 is related to the second phase current (the second inductive current) IL2. The sampling and holding circuit 70 samples and holds the first phase signal LX1 to generate a first signal ph1 and samples and holds the second phase signal LX2 to generate a second signal ph2.

The current balance regulating circuit 60 includes an error amplifier GM. The error amplifier GM may be a transconductance amplifier. The error amplifier GM generates a balance signal XG according to the first signal ph1 and the second signal ph2. The balance signal XG may be a current balancing signal. The current balance regulating circuit 60 generates a time signal (Ton_1, Ton_2) according to the balance signal XG. The so-called time signal may be the on-time signal in the pulse width modulation signal.

Specifically, the sampling and holding circuit 70 includes a first sampling and holding unit 72a and a second sampling and holding unit 72b. The first sampling and holding unit 72a receives the first phase signal LX1 to generate the first signal ph1. The second sampling and holding unit 72b receives the second phase signal LX2 to generate the second signal ph2.

The first sampling and holding unit 72a may include a first switch S1, a first capacitor CS1, a second switch S2 and a second capacitor CH1. The second sampling and holding unit 72b may include a third switch S3, a third capacitor CS2, a fourth switch S4 and a fourth capacitor CH2.

A first terminal of the first switch S1 receives the first phase signal LX1. The first capacitor CS1 is coupled between a second terminal of the first switch S1 and a ground. A first terminal of the second switch S2 is coupled to the second terminal of the first switch S1. The second capacitor CH1 is coupled between a second terminal of the second switch S2 and the ground. A coupling point between the second terminal of the second switch S2 and the second capacitor CH1 outputs the sampled and held first signal ph1. The first switch S1 and the second switch S2 are controlled by the first sampling control signal Sample_1 and the first holding control signal Hold_1 respectively. The first sampling control signal Sample_1 and the first holding control signal Hold_1 are mutually inverse.

A first terminal of the third switch S3 receives the second phase signal LX2. The third capacitor CS2 is coupled between a second terminal of the third switch S3 and the ground. A first terminal of the fourth switch S4 is coupled to the second terminal of the third switch S3. The fourth capacitor CH2 is coupled between a second terminal of the fourth switch S4 and the ground. A coupling point between the second terminal of the fourth switch S4 and the fourth capacitor CH2 outputs the sampled and held second signal ph2. The third switch S3 and the fourth switch S4 are controlled by the second sampling control signal Sample_2 and the second holding control signal Hold_2 respectively. The second sampling control signal Sample_2 and the second holding control signal Hold_2 are mutually inverse.

Figure 10:
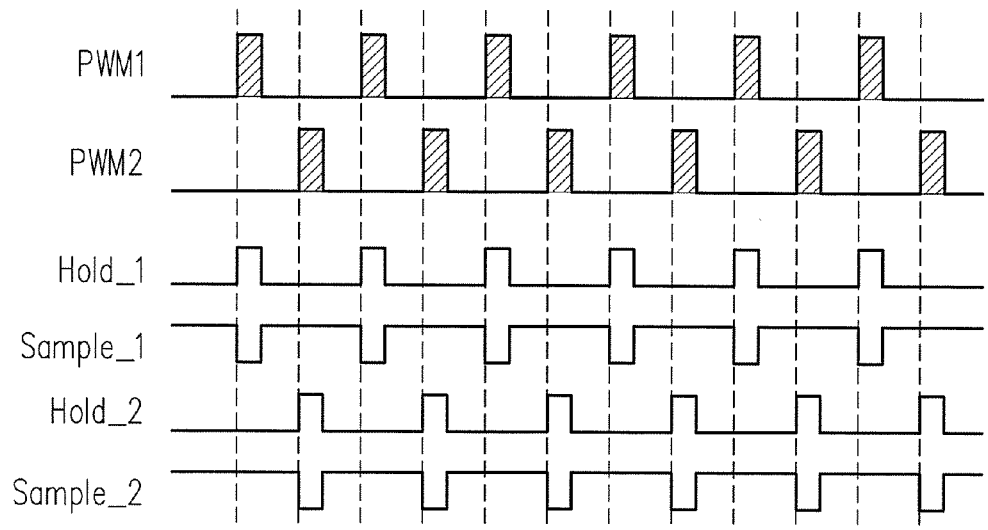
FIG. 10 is a waveform diagram related to the sampling and holding circuit operating in the pulse width modulation duty cycle less than 50% according to an embodiment of the invention.
Figure 11:
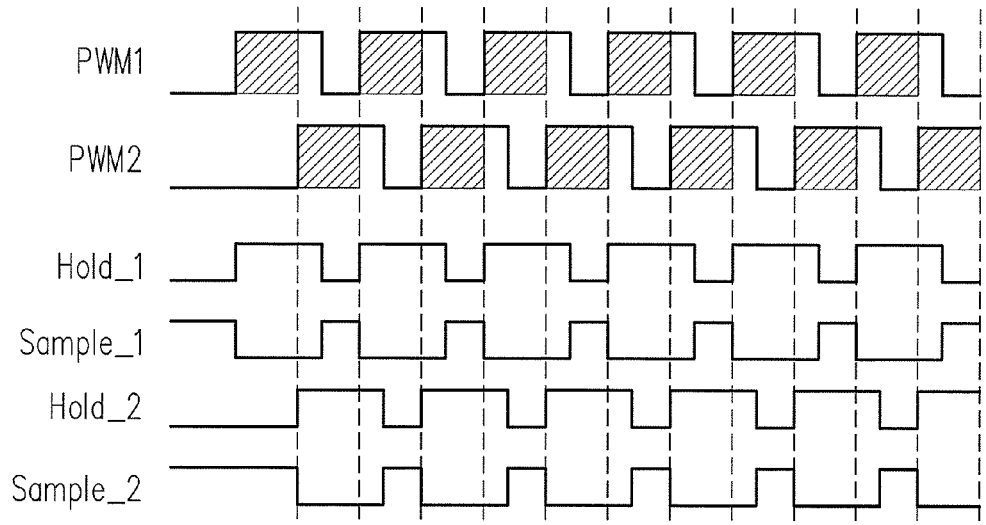
FIG. 11 is a waveform diagram related to the sampling and holding circuit operating in the pulse width modulation duty cycle greater than 50% according to an embodiment of the invention.

A sampling operation of the sampling and holding circuit 70 per cycle is as shown in FIG. 10 and FIG. 11. FIG. 10 is a waveform diagram related to the sampling and holding circuit operating in the pulse width modulation duty cycle (PWM duty cycle) less than 50% according to an embodiment of the invention. FIG. 11 is a waveform diagram related to the sampling and holding circuit operating in the pulse width modulation duty cycle greater than 50% according to an embodiment of the invention.

When the first phase pulse width modulation signal PWM1 is at logic low level, the logic control circuit 24 (as shown in FIG. 1) sets the first sampling control signal Sample_1 to logic high level, and sets the first holding control signal Hold_1 to logic low level. In contrast, when the first phase pulse width modulation signal PWM1 is at logic high level, the logic control circuit 24 sets the first sampling control signal Sample_1 to logic low level, and sets the first holding control signal Hold_1 to logic high level.

When the second phase pulse width modulation signal PWM2 is at logic low level, the logic control circuit 24 (as shown in FIG. 1) sets the second sampling control signal Sample_2 to logic high level, and sets the second holding control signal Hold_2 to logic low level. In contrast, when the second phase pulse width modulation signal PWM2 is at logic high level, the logic control circuit 24 sets the second sampling control signal Sample_2 to logic low level, and sets the second holding control signal Hold_2 to logic high level.

Also, in addition to the error amplifier GM, the current balance regulating circuit 60 further includes a switch unit. For example, the switch unit is one circuit that includes a fifth switch S5 to a tenth switch S10. The switch unit is coupled to the error amplifier GM. First of all, it is defined that one cycle include a first half-cycle and a second half-cycle. During the first half-cycle (the control signal SW1 is at logic high level and the control signal SW2 is at logic low level), the switch unit makes a first input terminal (−) and a second input terminal (+) of the error amplifier GM to receive the first signal ph1 and the second signal ph2 respectively to output a first error signal XG1, and an output terminal of the error amplifier GM is coupled to a first charging and discharging unit 62a. The first charging and discharging unit 62a generates a first time signal according to the first error signal XG1.

During the second half-cycle varied with time varied with time (the control signal SW1 is at logic low level and the control signal SW2 is at logic high level), the switch unit makes the first input terminal (−) and the second input terminal (+) of the error amplifier GM to exchange the received signals with each other to output a second error signal XG2, and the output terminal of the error amplifier GM is coupled to a second charging and discharging unit 62b. The second charging and discharging unit 62b generates a second time signal according to the second error signal XG2. The balance signal XG includes the first error signal XG1 and the second error signal XG2. The time signal includes the first time signal (Ton_1) and the second time signal (Ton_2).

Specifically, a first terminal of the fifth switch S5 and a first erminal of the seventh switch S7 receive the first signal ph1. A first terminal of the sixth switch S6 and a first terminal of the eighth switch S8 receive the second signal ph2. A first terminal of the ninth switch S9 is coupled to the output terminal of the error amplifier GM and a second terminal of the ninth switch S9 is coupled to the first charging and discharging unit 62a. A first terminal of the tenth switch S10 is coupled to the output terminal of the error amplifier GM and a second terminal of the tenth switch S10 is coupled to the second charging and discharging unit 62b. The first input terminal (−) of the error amplifier GM is coupled to a second terminal of the fifth switch S5 and a second terminal of the sixth switch S6, and the second input terminal (+) of the error amplifier is coupled to a second terminal of the seventh switch S7 and a second terminal of the eighth switch S8. The fifth switch S5, the eighth switch S8 and the ninth switch S9 are controlled by the first control signal SW1, and the sixth switch S6, the seventh switch S7 and the tenth switch S10 are controlled by the second control signal SW2.

A setting method related to the first control signal SW1 and the second control signal SW2 includes the followings. According to triggers of the comparing signal Xcm, the logic control circuit 24 (as shown in FIG. 1) sets the first control signal SW1 to "high" and resets the second control signal SW2 to "low" on a first trigger; resets the first control signal SW1 to "low" and sets the second control signal SW2 to "high" on a second trigger; sets the first control signal SW1 to "high" and resets the second control signal SW2 to "low" on a third trigger; resets the first control signal SW1 to "low" and sets the second control signal SW2 to "high" on a fourth trigger; and the rest may be deduced by analogy. The comparing signal Xcm is related to the ramp signal Xramp and the output voltage Vout.

Figure 8:
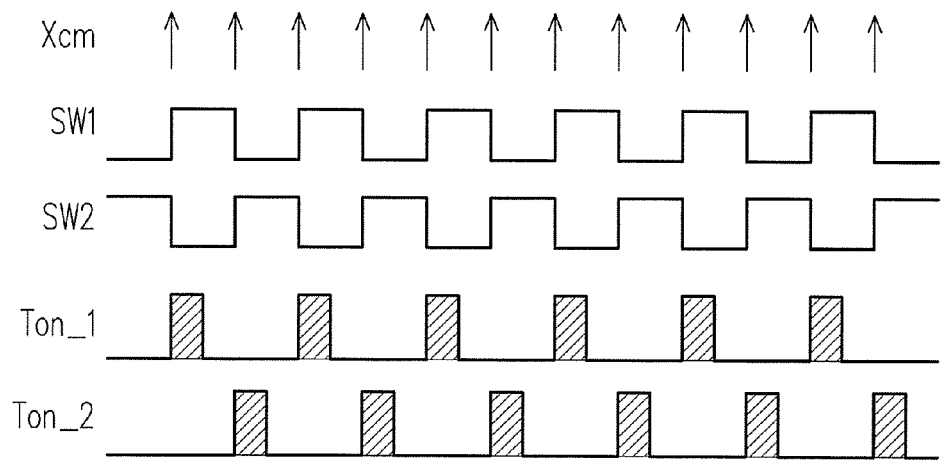
FIG. 8 is a waveform diagram related to the current balancing circuit operating in the pulse width modulation duty cycle less than 50% according to an embodiment of the invention
Figure 9:
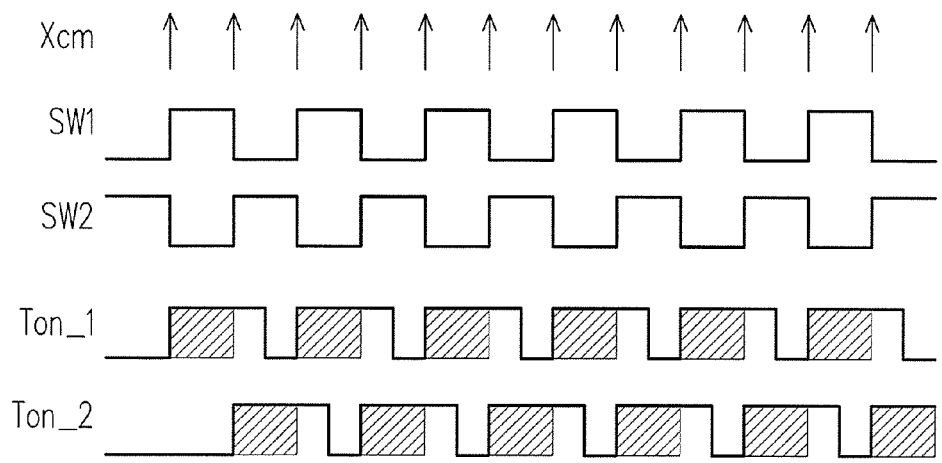
FIG. 9 is a waveform diagram related to the current balance regulating circuit operating in the pulse width modulation duty cycle greater than 50% according to an embodiment of the invention.

The control signals SW1 and SW2 of the switch unit in FIG. 6 are as shown by FIG. 8 and FIG. 9. FIG. 8 is a waveform diagram related to the current balancing circuit operating in the pulse width modulation duty cycle less than 50% according to an embodiment of the invention FIG. 9 is a waveform diagram related to the current balance regulating circuit operating in the pulse width modulation duty cycle greater than 50% according to an embodiment of the invention. In the drawing, shaded areas refer to counts for the current balance regulating circuit to function on the first on-time signal Ton_1 and the second on-time signal Ton_2. In FIG. 9, proportion of the first on-time signal Ton_1 or the second on-time signal Ton_2 at logic high level occupies approximately 70% of the entire cycle. Although the on-time may exceed 50% of the cycle, the control signals SW1 or SW2 at logic high level only occupies a half of the entire cycle. Therefore, an effect of the on-time for affecting the current balancing of the multi-phase power converter is 50% of the cycle.

On the other hand, the first charging and discharging unit 62a includes a first current source ITON_1, a fifth capacitor CT1 and an eleventh switch S11. The first current source ITON_1 is coupled to the second terminal of the ninth switch S9. The fifth capacitor CT1 is coupled to the first current source ITON_1, and the fifth capacitor CT1 is coupled between the second terminal of the ninth switch S9 and a ground. The eleventh switch S11 is connected to the fifth capacitor CT1 in parallel. The second charging and discharging unit 62b includes a second current source ITON_2, a sixth capacitor CT2 and a twelfth switch S12. The second current source ITON_2 is coupled to the second terminal of the tenth switch S10. The sixth capacitor CT2 is coupled to the second current source ITON_2, and the sixth capacitor CT2 is coupled between the second terminal of the tenth switch S10 and the ground. The twelfth switch S12 is connected to the sixth capacitor CT2 in parallel. The eleventh switch S11 and the twelfth switch S12 are controlled by an inversion signal PWMB1 of the first phase pulse width modulation signal PWM1 (as shown in FIG. 1) and an inversion signal PWMB2 of the second phase pulse width modulation signal PWM2 (as shown in FIG. 1) respectively.

Figure 3:
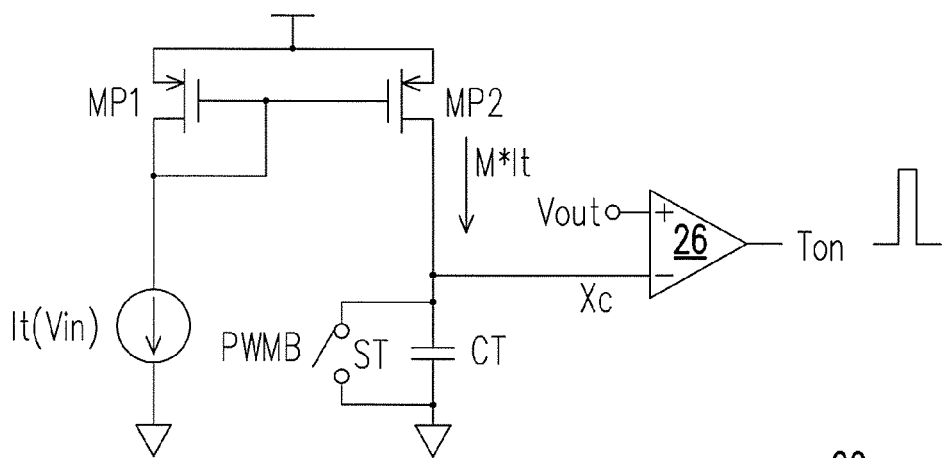
FIG. 3 is a circuit diagram of an on-time generator in conventional art.

A coupling point between the first current source ITON_1 and the fifth capacitor CT1 may be used to generate the charging voltage Xc similar to that illustrated in FIG. 3, which is used to generate the first on-timer signal Ton_1. A coupling point between the second current source ITON_2 and the sixth capacitor CT2 may be used to generate the charging voltage Xc similar to that illustrated in FIG. 3, which is used to generate the second on-timer signal Ton_2.

For instance, it is assumed that the first current source ITON_1 and the second current source ITON_2 in FIG. 6 are both of 2 uA, the first phase current IL1 is greater than the second phase current IL2, the first signal ph1=−5 mV, and the second signal ph2=−3 mV. During the first half-cycle, the error amplifier GM generates the first phase error signal XG1 according a difference between the two input terminals (2 mV), and the first error signal XG1 is of 1 uA that flows out from the error amplifier GM. Accordingly, a total of 3 uA will flow into the fifth capacitor CT1, so as to shorten a count time of the first on-time signal Ton_1 at "high". During the second half-cycle, the two input terminals exchange the received signals with each other. The error amplifier GM generates the second error signal XG2 according to a difference between the input terminals (−2 mV), and the second error signal XG2 is of 1 uA that flows into the error amplifier GM. Accordingly, only 1 uA flows into the sixth capacitor CT2, such that a count time of the second on-time signal Ton_2 at "high" is increased. As a result, the first phase current IL1 is reduced and the second phase current IL2 is increased correspondingly, so as facilitate in solving the current balance issue.

Moreover, a difference between the present embodiment of invention and the conventional technology is that, the conventional technology uses the amplifier to convert the voltage information into the current information before using the current mirrors to perform the sampling and folding operation. However, in the present embodiment of the invention, the sampling and the holding operation is performed first for the first phase signal LX1 and the second phase signal LX2 and yet the current mirrors are not used during the sampling and the holding operation. The balance signal may be generated by the same error amplifier according to the first signal ph1 and the second signal ph2. As such, the present embodiment of the invention is capable of reducing the imbalance of each phase current caused by the offset values between different elements (e.g., the circuit including two sets of "the amplifier and the multiple current mirrors") in conventional technology.

Hereinafter, another embodiment is provided below and served to describe the architecture based on the time signal generating circuit 6 in more detail.

Figure 4:
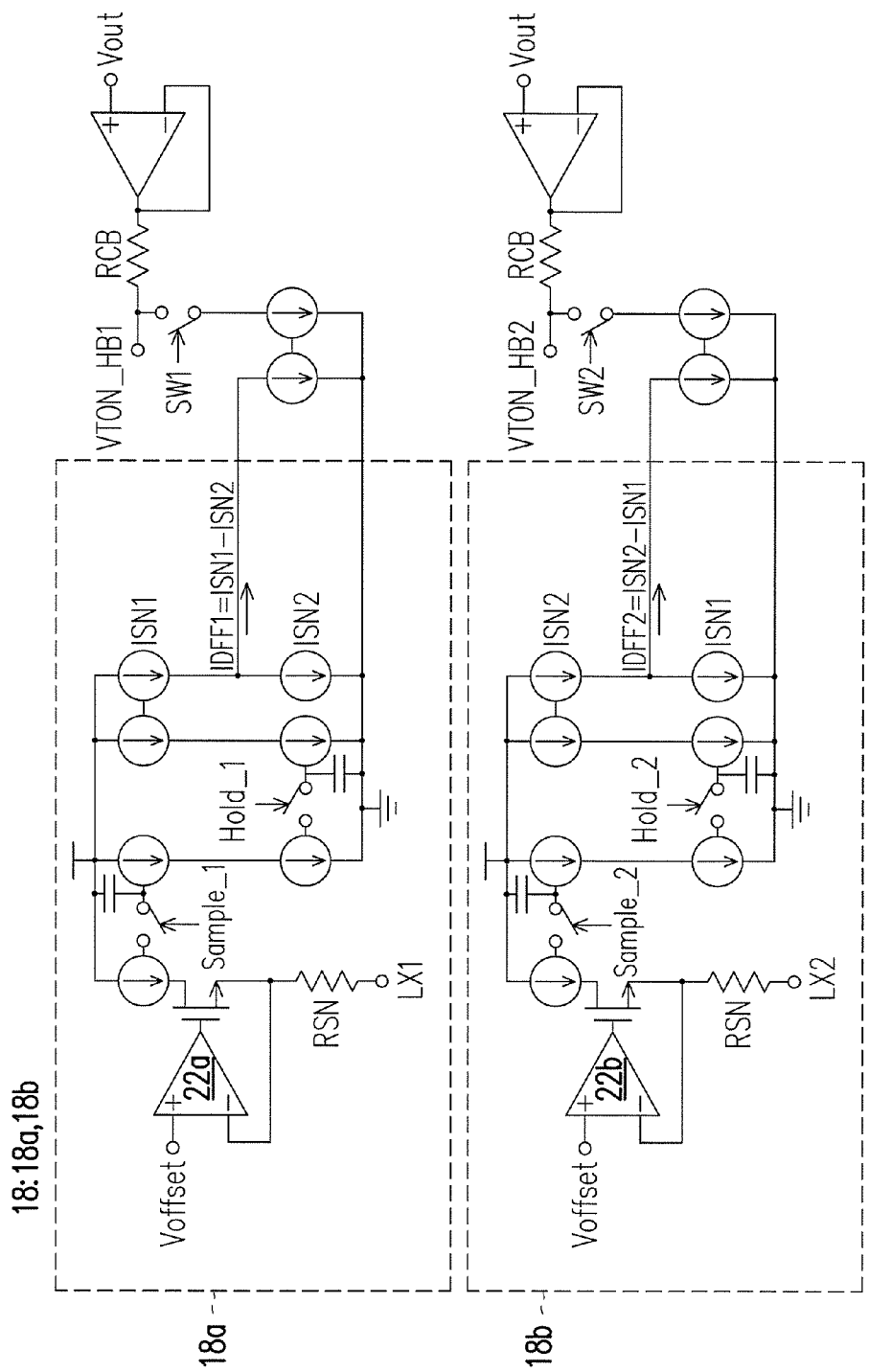
FIG. 4 is a circuit diagram applying the current balancing circuit in conventional art.
Figure 5:
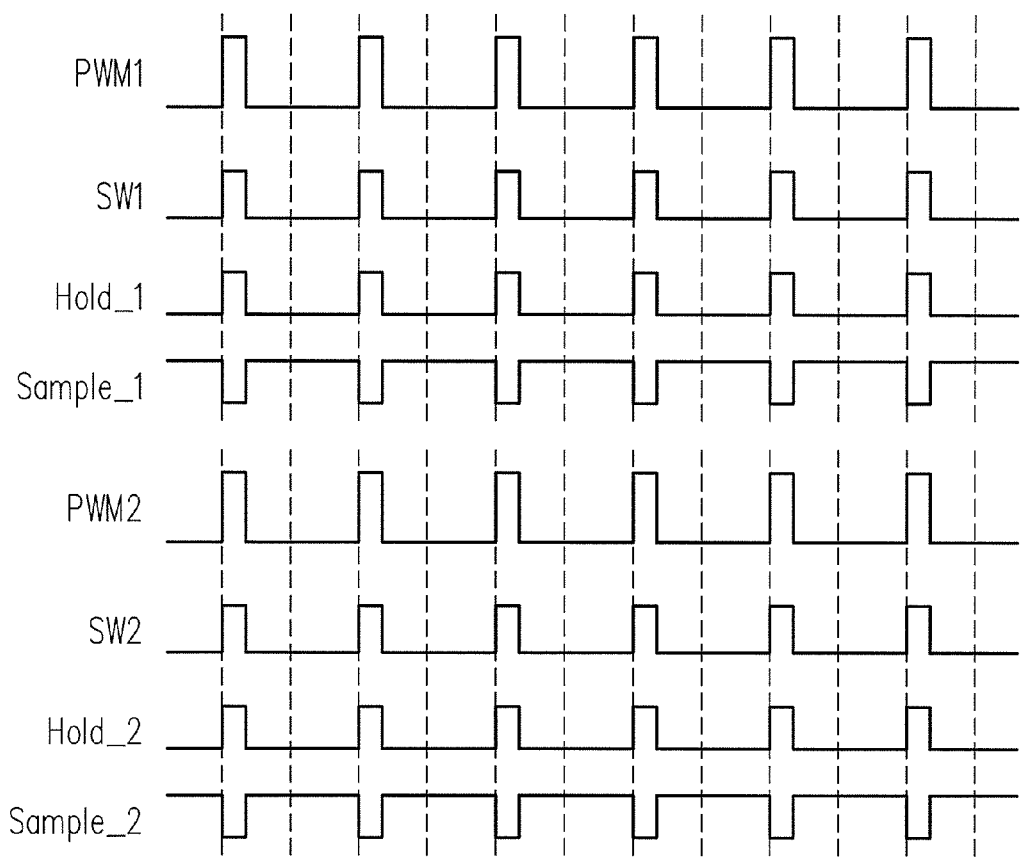
FIG. 5 is a waveform diagram of the related signals in FIG. 4.
Figure 12:
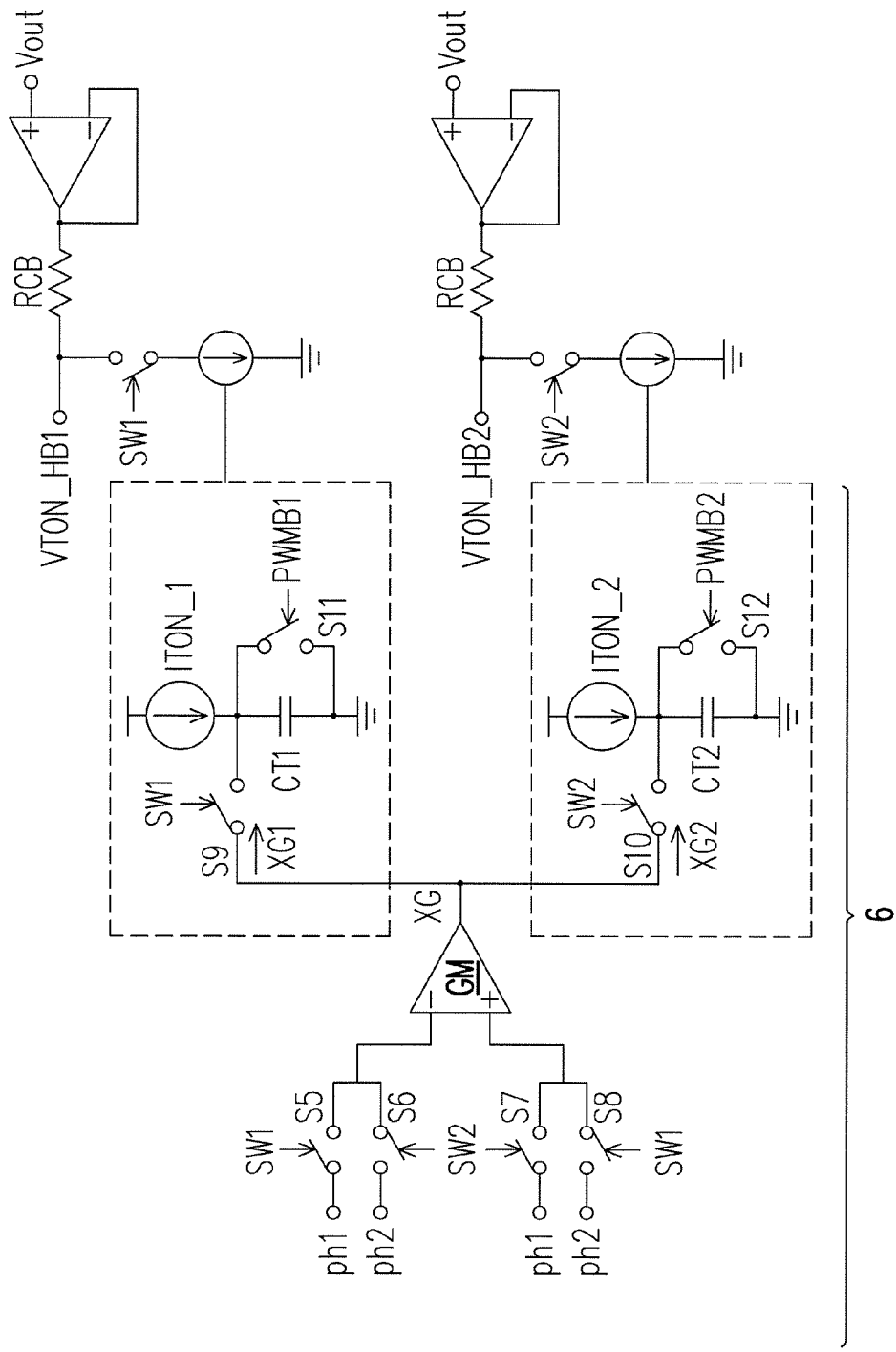
FIG. 12 is a circuit diagram for calculating a high-boundary voltage according to an embodiment of the invention.

FIG. 12 is a circuit diagram for calculating a high-boundary voltage according to an embodiment of the invention. The time signal generating circuit 6 may be used to replace a part of the circuit in FIG. 4, the first error signal XG1 generated by the error amplifier GM may be used to calculate the high-boundary voltage VTON_HB1, and the second error signal XG2 generated by the error amplifier GM may be used to calculate the high-boundary voltage VTON_HB2.

Figure 13:
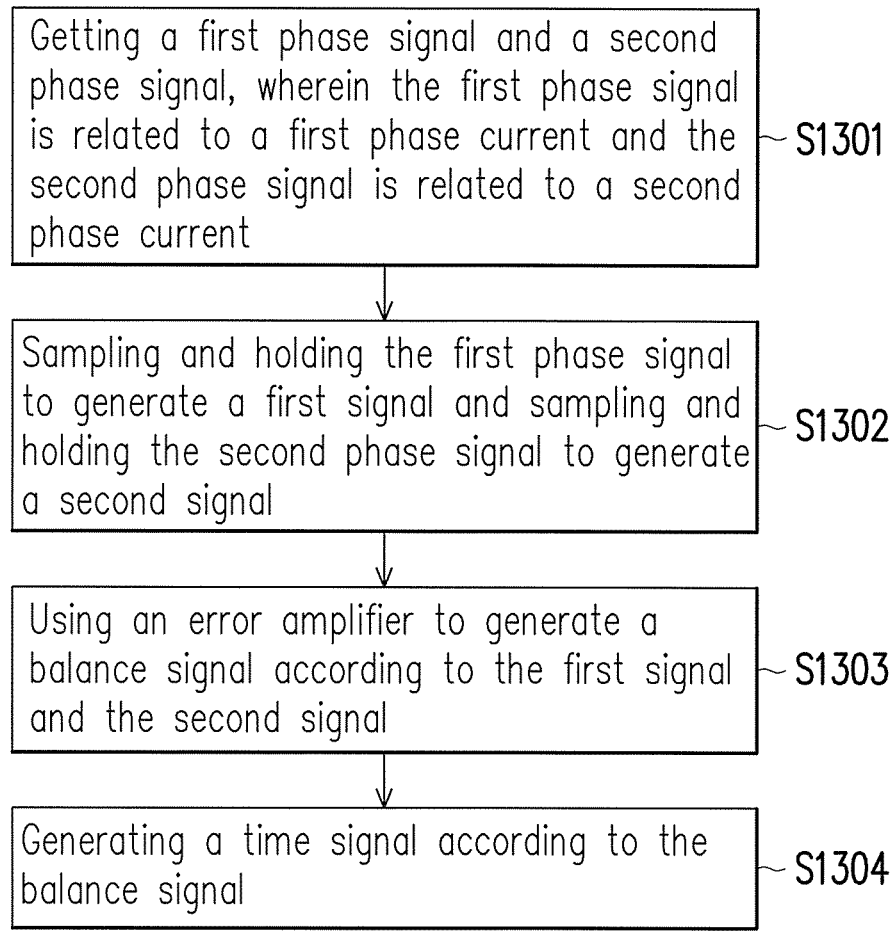
FIG. 13 is a flow chart illustrating a time signal generating method of a multi-phase power converter according to an embodiment of the invention.

Based on the content disclosed in the foregoing embodiments, a time signal generating method for general multi-phase power converter may be summarized as follows. More specifically, FIG. 13 is a flow chart illustrating a time signal generating method of a multi-phase power converter according to an embodiment of the invention. Referring to FIG. 6, FIG. 7 and FIG. 13 together, the time signal generating method of the present embodiment may include the following steps.

As shown in step S1301, a first phase signal and a second phase signal are got, wherein the first phase signal LX1 is related to a first phase current IL1 and the second phase signal LX2 is related to a second phase current IL2.

As shown in step S1302, the first phase signal LX1 is sampled and held to generate a first signal ph1 and the second phase signal LX2 is sampled and held to generate a second signal ph2.

As shown in step S1303, an error amplifier GM is used to generate a balance signal XG according to the first signal ph1 and the second signal ph2.

Subsequently, as shown in step S1304, a time signal is generated according to the balance signal XG.

In addition, step S1303 may further includes the following steps. The first signal ph1 and the second signal ph2 are received respectively by a first input terminal and a second input terminal of the error amplifier GM during a first half-cycle to generate a first error signal XG1, and the received signals are exchanged with each other by the first input terminal and the second input terminal of the error amplifier GM during a second half-cycle varied with time to generate a second error signal XG2. The balance signal XG includes the first error signal XG1 and the second error signal XG2.

In addition, step S1304 may further includes the following steps. A first time signal (Ton_1) is generated according to the first error signal XG1 during the first half cycle, and a second time signal (Ton_2) is generated according to the second error signal XG2 during the second half-cycle, The time signal includes the first time signal (Ton_1) and the second time signal (Ton_2).

In addition, step S1304 may further includes the following steps. A current of an on-time generator is affected according to the balance signal to generate the time signal. Alternatively, a counting high-boundary voltage of an on-time generator is affected according to the balance signal to generate the time signal.

In summary, according to the time signal generating circuit and the time signal generating method of the invention, when the current balance of the multi-phase power converter is to be calculated, the same error amplifier may be used to reduce the offset values of the inductive currents for each phase. In addition, the first signal and the second signal are received respectively by the first input terminal and the second input terminal of the error amplifier during the first half-cycle to generate the first error signal, and the received signals are exchanged with each other by the first input terminal and the second input terminal of the error amplifier during the second half-cycle varied with time to generate the second error signal. As such, by performing the sampling and holding operation first before using the same error amplifier to generate the balance signal according to the first signal and the second signal, the imbalance of each phase current caused by the offset values between different elements (e.g., the circuit including two sets of "the amplifier and the multiple current mirrors") in conventional technology may be avoided.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

Any of the embodiments or any of the claims of the invention does not need to achieve all of the objects, advantages or features disclosed by the invention. Moreover, the abstract and the headings are merely used to aid in searches of patent files and are not intended to limit the scope of the claims of the present invention.

What is claimed is:

1. A time signal generating method, comprising:
   (A) getting a first phase signal and a second phase signal, wherein the first phase signal is related to a first phase current and the second phase signal is related to a second phase current;
   (B) sampling and holding the first phase signal to generate a first signal and sampling and holding the second phase signal to generate a second signal;
   (C) using an error amplifier to generate a balance signal according to the first signal and the second signal; and
   (D) generating a time signal according to the balance signal.

2. The time signal generating method of claim 1, wherein the step (C) further comprises:
   receiving the first signal and the second signal respectively by a first input terminal and a second input terminal of the error amplifier during a first half-cycle to generate a first error signal, and exchanging the received signals with each other by the first input terminal and the second input terminal of the error amplifier during a second half-cycle varied with time to generate a second error signal, wherein the balance signal comprises the first error signal and the second error signal, and one cycle includes the first half-cycle and the second half-cycle.

3. The time signal generating method of claim 2, wherein the step (D) further comprises:
generating a first time signal according to the first error signal during the first half cycle, and generating a second time signal according to the second error signal during the second half-cycle, wherein the time signal comprises the first time signal and the second time signal.

4. The time signal generating method of claim 1, wherein when an on-time of the time signal exceeds 50% of a cycle, an effect of the on-time for affecting a current balancing of a multi-phase power converter is 50% of the cycle.

5. The time signal generating method of claim 1, wherein the step (D) further comprises:
affecting a current of an on-time generator according to the balance signal to generate the time signal.

6. The time signal generating method of claim 1, wherein the step (D) further comprises:
affecting a counting high-boundary voltage of an on-time generator according to the balance signal to generate the time signal.

7. A time signal generating circuit, comprising:
a sampling and holding circuit, getting a first phase signal and a second phase signal, and the sampling and holding circuit sampling and holding the first phase signal to generate a first signal and sampling and holding the second phase signal to generate a second signal, wherein the first phase signal is related to a first phase current and the second phase signal is related to a second phase current; and
a current balance regulating circuit including an error amplifier, the error amplifier generating a balance signal according to the first signal and the second signal, and the time signal generating circuit generating a time signal according to the balance signal.

8. The time signal generating circuit of claim 7, wherein the sampling and holding circuit comprises:
a first sampling and holding unit, receiving the first phase signal to generate the first signal; and
a second sampling and holding unit, receiving the second phase signal to generate the second signal.

9. The time signal generating circuit of claim 8,
wherein the first sampling and holding unit comprises:
a first switch, having a first terminal receiving the first phase signal;
a first capacitor, coupled between a second terminal of the first switch and a ground;
a second switch, having a first terminal coupled to the second terminal of the first switch; and
a second capacitor, coupled between a second terminal of the second switch and the ground, wherein a coupling point between the second terminal of the second switch and the second capacitor outputs the first signal;
wherein the first switch and the second switch are controlled by a first sampling control signal and a first holding control signal respectively, and the first sampling control signal and the first holding control signal are mutually inverse;
wherein the second sampling and holding unit comprises:
a third switch, having a first terminal receiving the second phase signal;
a third capacitor, coupled between a second terminal of the third switch and the ground;
a fourth switch, having a first terminal coupled to the second terminal of the third switch; and
a fourth capacitor, coupled between a second terminal of the fourth switch and the ground, wherein a coupling point between the second terminal of the fourth switch and the fourth capacitor outputs the second signal;
wherein the third switch and the fourth switch are controlled by a second sampling control signal and a second holding control signal respectively, and the second sampling control signal and the second holding control signal are mutually inverse.

10. The time signal generating circuit of claim 7, wherein a first input terminal and a second input terminal of the error amplifier receive the first signal and the second signal respectively during a first half-cycle to generate a first error signal, and the first input terminal and the second input terminal of the error amplifier exchange the received signals with each other during a second half-cycle varied with time to generate a second error signal, wherein the balance signal comprises the first error signal and the second error signal, and one cycle includes the first half-cycle and the second half-cycle.

11. The time signal generating circuit of claim 7, wherein the current balance regulating circuit comprises:
the error amplifier; and
a switch unit, comprising a plurality of switches, and the switch unit being coupled to the error amplifier;
wherein the switch unit makes a first input terminal and a second input terminal of the error amplifier to receive the first signal and the second signal respectively during a first half-cycle to generate a first error signal, and an output terminal of the error amplifier is coupled to a first charging and discharging unit, wherein the first charging and discharging unit generates a first time signal according to the first error signal;
and the switch unit makes the first input terminal and the second input terminal of the error amplifier to exchange the received signals with each other during a second half-cycle varied with time to generate a second error signal, and the output terminal of the error amplifier is coupled to a second charging and discharging unit, wherein the second charging and discharging unit generates a second time signal according to the second error signal;
wherein the balance signal comprises the first error signal and the second error signal, the time signal comprises the first time signal and the second time signal, and one cycle includes the first half-cycle and the second half-cycle.

12. The time signal generating circuit of claim 11, wherein the switch unit comprises:
a fifth switch, having a first terminal receiving the first signal;
a sixth switch, having a first terminal receiving the second signal;
a seventh switch, having a first terminal receiving the first signal;
an eighth switch, having a first terminal receiving the second signal;
a ninth switch, having a first terminal coupled to the output terminal of the error amplifier and a second terminal coupled to the first charging and discharging unit; and
a tenth switch, having a first terminal coupled to the output terminal of the error amplifier and a second terminal coupled to the second charging and discharging unit;
wherein a first input terminal of the error amplifier is coupled to a second terminal of the fifth switch and a second terminal of the sixth switch, and a second input terminal of the error amplifier is coupled to a second terminal of the seventh switch and a second terminal of the eighth switch;

wherein the fifth switch, the eighth switch and the ninth switch are controlled by a first control signal, the sixth switch, the seventh switch and the tenth switch are controlled by a second control signal, the first control signal and the second control signal are a logic first level and a logic second level respectively during the first half-cycle, and the first control signal and the second control signal are the logic second level and the logic first level respectively during the second half-cycle.

13. The time signal generating circuit of claim 12, wherein the first control signal is set and the second control signal is reset according to a comparing signal, or the first control signal is reset and the second control signal is set according to the comparing signal, wherein the comparing signal is related to a ramp signal and an output voltage.

14. The time signal generating circuit of claim 12, wherein the first charging and discharging unit comprises:
   a first current source, coupled to the second terminal of the ninth switch;
   a fifth capacitor, coupled to the first current source, and coupled between the second terminal of the ninth switch and a ground; and
   an eleventh switch, connected to the fifth capacitor in parallel;
   wherein the second charging and discharging unit comprises:
      a second current source, coupled to the second terminal of the tenth switch;
      a sixth capacitor, coupled to the second current source, and coupled between the second terminal of the tenth switch and the ground; and
      a twelfth switch, connected to the sixth capacitor in parallel;
   wherein the eleventh switch and the twelfth switch are controlled by an inversion signal of a first phase pulse width modulation signal and an inversion signal of a second phase pulse width modulation signal respectively.

15. The time signal generating circuit of claim 7, wherein when an on-time of the time signal exceeds 50% of a cycle, an effect of the on-time for affecting a current balancing of a multi-phase power converter is 50% of the cycle.

16. The time signal generating circuit of claim 7, disposed in a multi-phase power converter, and the multi-phase power converter comprises:
   an on-time generator, affecting a current of the on-time generator according to the balance signal to generate the time signal.

17. The time signal generating circuit of claim 7, disposed in a multi-phase power converter, and the multi-phase power converter comprises:
   an on-time generator, affecting a counting high-boundary voltage of the on-time generator according to the balance signal to generate the time signal.

* * * * *